US012717980B2

(12) United States Patent
Liu

(10) Patent No.: US 12,717,980 B2
(45) Date of Patent: Aug. 25, 2026

(54) INTERIOR-LAYOUT ASSISTANCE METHOD, INTERIOR-LAYOUT ASSISTANCE SYSTEM, AND PROGRAM

(71) Applicant: nat Inc., Tokyo (JP)

(72) Inventor: Rongjun Liu, Tokyo (JP)

(73) Assignee: nat Inc., Tokyo (JP)

( * ) Notice: Subject to any disclaimer, the term of this patent is extended or adjusted under 35 U.S.C. 154(b) by 156 days.

(21) Appl. No.: 18/728,455

(22) PCT Filed: Dec. 19, 2023

(86) PCT No.: PCT/JP2023/045553

§ 371 (c)(1),
(2) Date: Jul. 12, 2024

(87) PCT Pub. No.: WO2024/262060

PCT Pub. Date: Dec. 26, 2024

(65) Prior Publication Data

US 2026/0004011 A1 Jan. 1, 2026

(30) Foreign Application Priority Data

Jun. 23, 2023 (JP) ................................ 2023-102990

(51) Int. Cl.
*G06F 30/13* (2020.01)
*G06Q 30/0601* (2023.01)
*G06Q 50/08* (2012.01)

(52) U.S. Cl.
CPC ......... *G06F 30/13* (2020.01); *G06Q 30/0623* (2013.01); *G06Q 30/06311* (2025.08); *G06Q 50/08* (2013.01)

(58) Field of Classification Search
CPC ...... G06F 30/13; G06F 2111/20; G06F 30/12; G06F 30/27; G06Q 30/0623;
(Continued)

(56) References Cited

U.S. PATENT DOCUMENTS

2021/0019453 A1* 1/2021 Yang ........................ G06F 30/12
2024/0119316 A1* 4/2024 Tu ............................ G06N 5/04

FOREIGN PATENT DOCUMENTS

CN 1346113 A 4/2002
CN 107657551 A * 2/2018 ............ G06Q 50/16
(Continued)

OTHER PUBLICATIONS

Office Action issued on Jun. 20, 2025, in corresponding Chinese Application No. 202380014904.7, 12 pages.
(Continued)

*Primary Examiner* — Yuhui R Pan
(74) *Attorney, Agent, or Firm* — Maier & Maier, PLLC

(57) ABSTRACT

An interior-layout assistance method that is useful in considering a layout of products in an interior. A first step of acquiring or generating 3D CAD data of an interior, a second step of designating, by a user, a classification of and a budget for a product being an at least one of furniture and a home appliance to be arranged in the interior, a step of determining arrangement candidates that are presented as different combinations of a space in which the product can be arranged among spaces in the interior and a product to be arranged in the space, the determining of the arrangement candidates performed on a basis of the 3D CAD data acquired or generated in the first step and the classification and budget for the product, the classification and the budget being designated in the second step, and a step of displaying a 3D CAD image.

12 Claims, 9 Drawing Sheets

(58) Field of Classification Search
CPC ............. G06Q 30/06311; G06Q 50/08; G06Q 30/0643; G06Q 30/0601
See application file for complete search history.

(56) References Cited

FOREIGN PATENT DOCUMENTS

| | | | | | |
|---|---|---|---|---|---|
| CN | 113255052 | A | * | 8/2021 | ............. G06Q 50/08 |
| JP | 2005-242925 | A | | 9/2005 | |
| JP | 2013-196426 | A | | 9/2013 | |
| JP | 2017-151744 | A | | 8/2017 | |
| JP | 2018-088139 | A | | 6/2018 | |
| JP | 2021523493 | A | * | 9/2021 | ............. G06T 19/00 |
| JP | 2023-018884 | A | | 2/2023 | |

OTHER PUBLICATIONS

Notice of Reasons for Refusal issued on Sep. 26, 2023, in corresponding Japanese application No. 2023-102990; 15 pages.
International Search Report issued on Mar. 5, 2024, in corresponding International Application No. PCT/JP2023/045553, 6 pages.
Written Opinion issued on Mar. 5, 2024, in corresponding International Application No. PCT/JP2023/045553, 6 pages.
Decision of Rejection issued on Mar. 6, 2026, in corresponding Chinese Application No. 202380014904.7, 14 pages.
Liu, "Navigation and Location Services Practice Manual", Huazhong University of Science and Technology Press, Mar. 2023, 1st Edition, 1st Printing, 12 pages.

* cited by examiner

INTERIOR-LAYOUT ASSISTANCE METHOD, INTERIOR-LAYOUT ASSISTANCE SYSTEM, AND PROGRAM

TECHNICAL FIELD

The present invention relates to an interior-layout assistance method, an interior-layout assistance system, and a program that are used in considering a layout of products in an interior.

BACKGROUND

For example, in an industry of businesses relating to real estate, such as construction, renovation, and moving, safety performance and accuracy are highly demanded. In addition, drawing of, for example, blueprints and floor plans for a site is one of necessary tasks. Hitherto, these are drawn by architects and CAD experts.

In this case, first, a survey on the site is conducted, and a scaled plan blueprint is drawn on the basis of the survey. Then, technical symbols, numerical values, materials, colors, and the like are added to the blueprint. These tasks to complete the blueprint alone take approximately one to two weeks.

CITATION LIST

Patent Literature

[PTL 1] Japanese Patent Application Laid-open No. 2021-012528

SUMMARY

Drawings and instructions prepared in this way help creation of stereoscopic images in the minds of readers. Furnishing according to written dimensions, wire routing, installation, coloring, and the like are performed.

There are a wide variety of providers involved in construction and renovation of buildings. Thus, these providers carefully progress work while coordinating with each other at each step so that the stereoscopic images in their minds remain consistent with each other.

Further, the providers each work with dozens of paper-based drawn blueprints and instructions in their hands. Thus, an enormous number of paper sheets are required.

Currently, there are such problems of wasting "man-power," "time," and "resources" at work sites.

Still further, there is a demand for efficiently selecting and purchasing products such as home appliances and furniture on the basis of interior CAD data.

The present invention has been made in view of such circumstances, and an object thereof is to provide an interior-layout assistance method, an interior-layout assistance system, and a program that are useful in arranging a product in an interior, specifically, in considering an arrangement position of the product and selecting the product to be purchased.

Solution to Problem

According to the present invention, there is provided an interior-layout assistance method including:

a first step of acquiring or generating 3D CAD data of an interior;

a second step of receiving designation of a classification of and a budget for a product being an at least one of furniture and a home appliance to be arranged in the interior, the designation being received from a user;

a third step of determining a plurality of arrangement candidates that are presented as different combinations of a space in which the product can be arranged among spaces in the interior and a product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of associating 3D CAD data of interiors of users who have ever purchased products, a plurality of arrangement candidates selected by the users, and a product purchased by the user with each other as history data, and storing the history data into a memory, the first step, the second step, the third step, the fourth step, the fifth step, and the sixth step being carried out by a computer, the third step including determining, as arrangement candidates and products with high priorities, arrangement candidates and products that correspond to combinations with high similarity to a combination of the 3D CAD data of the interior, the designated classification, and the budget corresponding to the designated classification among the arrangement candidates and the products that have ever been selected by the other users, the determining of the arrangement candidates and the products with the high priorities being performed on a basis of the history data stored in the memory in the sixth step, the third step including determining the plurality of arrangement candidates and the products with use of a learning model obtained by machine learning in which combinations of the 3D CAD data of the interiors of the users who have ever purchased the products, the plurality of arrangement candidates selected by the users, the product purchased by the user, and attributes of the users are used as training data.

In the present invention, a first step of acquiring or generating 3D CAD data of an interior;

a second step of receiving designation of a classification of and a budget for a product being an at least one of furniture and a home appliance to be arranged in the interior, the designation being received from a user;

a third step of determining a plurality of arrangement candidates that are presented as different combinations of a space in which the product can be arranged among spaces in the interior and a product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of associating 3D CAD data of interiors of users who have ever purchased products, the products purchased by the users, and prices of the products purchased by the users with each other as history data, and storing the history data into a memory, are carried out by a computer, and the third step includes executing a process of determining the plurality of arrangement candidates and products with use of a learning model obtained by machine learning in which combinations of the 3D CAD data of the interiors of the users who have ever purchased the products and the products purchased by the users are used as training data, and displaying, as arrangement candidates and products with high priorities, arrangement candidates and products that correspond to combinations with high similarity to a combination of the 3D CAD data of the interior, the designated classification, and the budget corresponding to the designated classification, the displaying of the arrangement candidates and the products with the high priorities being performed on a basis of the history data stored in the memory in the sixth step and from among the plurality of determined arrangement candidates and the determined products among the arrangement candidates and the products that have ever been selected by the other users.

Further, according to the present invention, there is provided a program for causing a computer to carry out:

a first step of acquiring or generating 3D CAD data of an interior;

a second step of receiving designation of a classification of and a budget for a product being an at least one of furniture and a home appliance to be arranged in the interior, the designation being received from a user;

a third step of determining a plurality of arrangement candidates that are presented as different combinations of a space in which the product can be arranged among spaces in the interior and a product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of associating 3D CAD data of interiors of users who have ever purchased products, a plurality of arrangement candidates selected by the users, and a product purchased by the user with each other as history data, and storing the history data into a memory, the third step including determining, as arrangement candidates and products with high priorities, arrangement candidates and products that correspond to combinations with high similarity to a combination of the 3D CAD data of the interior, the designated classification, and the budget corresponding to the designated classification among the arrangement candidates and the products that have ever been selected by the other users, the determining of the arrangement candidates and the products with the high priorities being performed on a basis of the history data stored in the memory in the sixth step, the third step including determining the plurality of arrangement candidates and the products with use of a learning model obtained by machine learning in which combinations of the 3D CAD data of the interiors of the users who have ever purchased the products, the plurality of arrangement candidates selected by the users, the product purchased by the user, and attributes of the users are used as training data.

Still further, according to the present invention, there is provided a program for causing a computer to carry out:

a first step of acquiring or generating 3D CAD data of an interior;

a second step of receiving designation of a classification of and a budget for a product being an at least one of furniture and a home appliance to be arranged in the interior, the designation being received from a user;

a third step of determining a plurality of arrangement candidates that are presented as different combinations of a space in which the product can be arranged among spaces in the interior and a product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of associating 3D CAD data of interiors of users who have ever purchased products, the products purchased by the users, and prices of the products purchased by the users with each other as history data, and storing the history data into a memory, the third step including executing a process of determining the plurality of arrangement candidates and products with use of a learning model obtained by machine learning in which combinations of the 3D CAD data of the interiors of the users who have ever purchased the products and the products purchased by the users are used as training data, and displaying, as arrangement candidates and products with high priorities, arrangement candidates and products that correspond to combinations with high similarity to a combination of the 3D CAD data of the interior, the designated classification, and the budget corresponding to the designated classification, the displaying of the arrangement candidates and the products with the high priorities being performed on a basis of the history data stored in the memory in the sixth step and from among the plurality of determined arrangement candidates and the determined products among the arrangement candidates and the products that have ever been selected by the other users.

Advantageous Effects of Invention

According to the present invention, it is possible to provide the interior-layout assistance method, the interior-layout assistance system, and the program that are useful in arranging a product in an interior, specifically, in considering an arrangement position of the product and selecting the product to be purchased.

DETAILED DESCRIPTION OF EMBODIMENTS

First Embodiment

An interior-layout assistance method according to this embodiment can be implemented by using a communication terminal device 11 such as a smartphone. Although 3D modeling applications using LiDAR have already been available, the method according to this embodiment can be distinguished from these models in capability to perform measurement in units of millimeters. For example, dimensions of a captured room are displayed on a management screen.

In the construction industry, when, for example, renovating a room, staff manually prepares drawings and performs measurement by using a tape measure, which involves an increase in cost. Efficiency of these tasks can be enhanced by the interior-layout assistance method according to this embodiment.

The interior-layout assistance method according to this embodiment includes generating 3D CAD data of an interior by using the communication terminal device, specifically, by scanning the interior by laser radiation and with a camera, and specifying a size of the interior on the basis of the CAD data.

For example, the interior-layout assistance method according to this embodiment includes displaying 3D CAD images of the interior on the basis of the CAD data.

Figure 2:
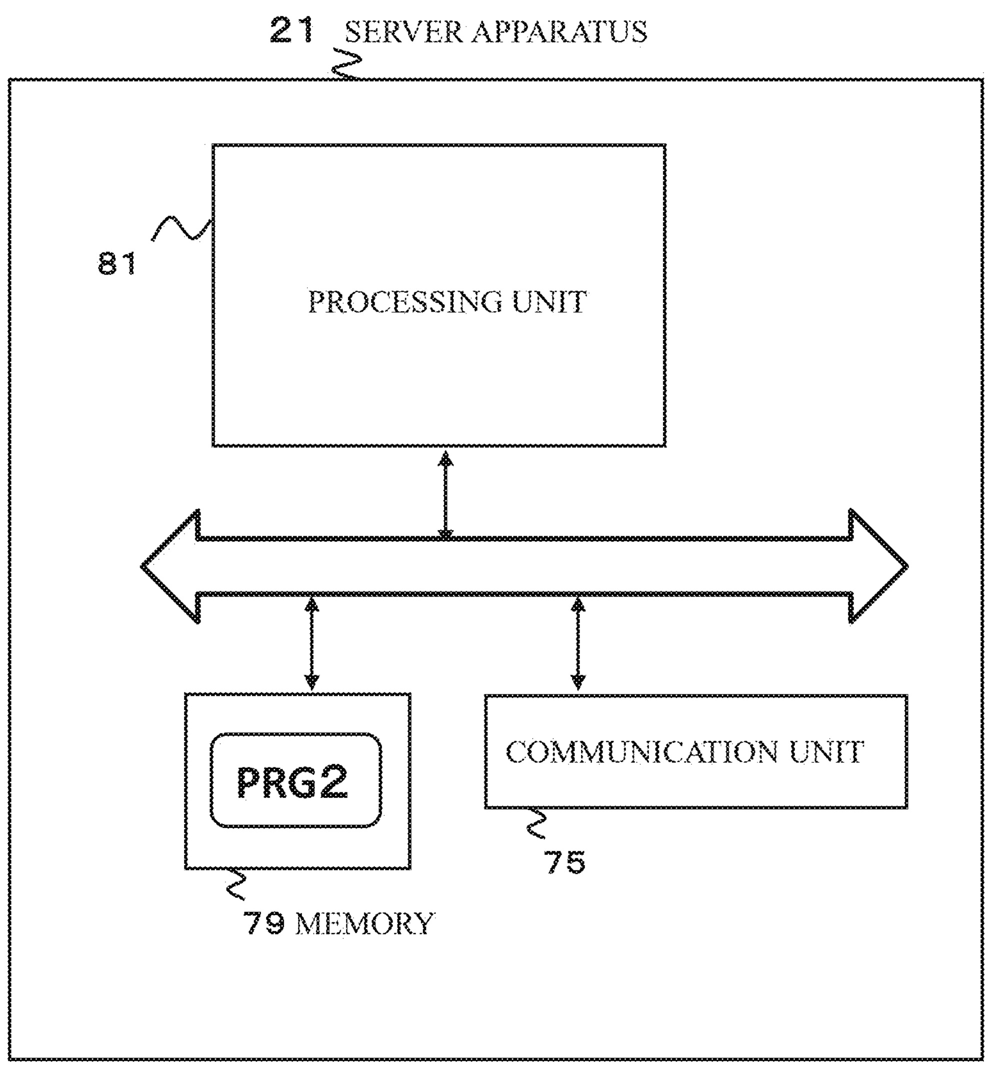
FIG. 2 is a function block diagram of a server apparatus according to the embodiments of the present invention.
Figure 3:
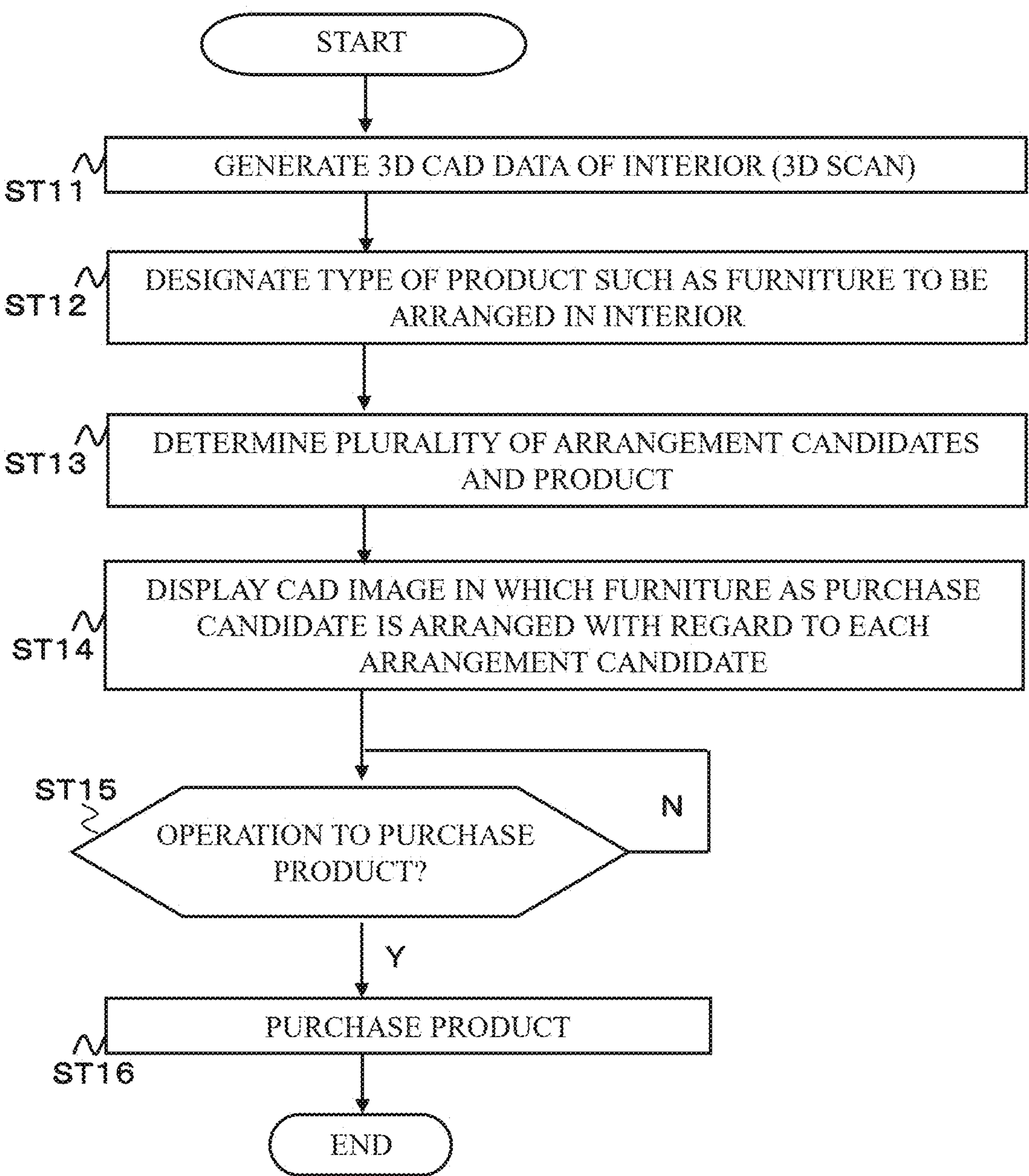
FIG. 3 is an explanatory flowchart showing an overall procedure of an interior-layout assistance method according to a first embodiment of the present invention.

The specified size of the interior is shown in the 3D CAD images. Specifically, as depicted in FIG. 1 to FIG. 3, heights to a ceiling, vertical and lateral sizes of a floor of the interior, and the like are shown in the 3D CAD images.

Figure 1:
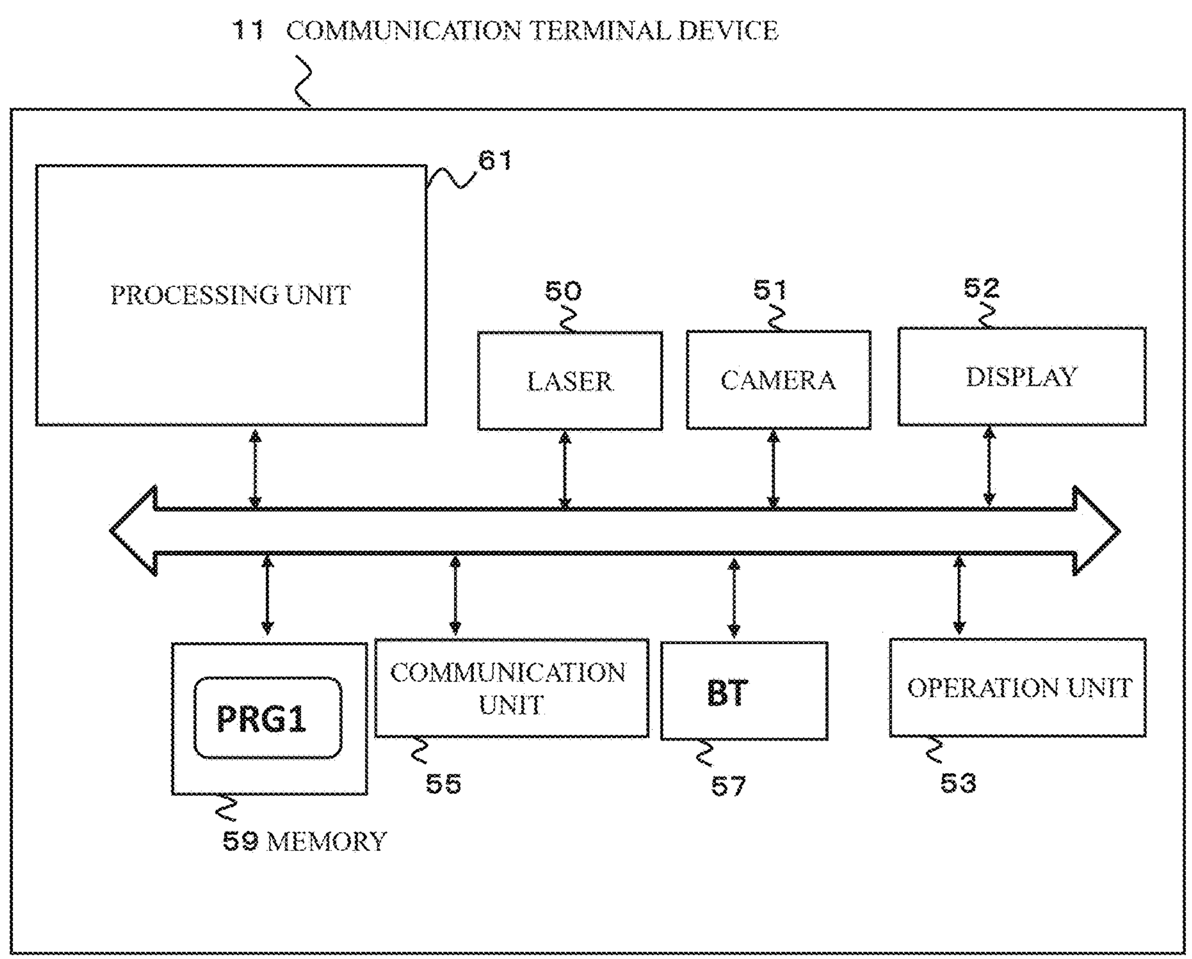
FIG. 1 is a function block diagram of a communication terminal device according to embodiments of the present invention.

FIG. 1 is a function block diagram of the communication terminal device 11 according to the embodiments of the present invention.

As shown in FIG. 1, the communication terminal device 11 includes a laser 50, a camera 51, a display 52, an operation unit 53, a communication unit 55, a Bluetooth (trademark) communication unit 57, a memory 59, and a processing unit 61.

While a user moves around the interior, the laser 50 radiates laser light to the interior, and receives reflection of the light.

While the user moves around the interior, the camera 51 captures the interior and generates capture data.

Management is performed so that measurement results acquired by the laser 50, and results of the capture by the camera 51 can be synchronized with each other.

The display 51 displays images based on signals from the processing unit 61.

The operation unit 53 is operation means such as a touchscreen, a keyboard, and a mouse.

The communication unit 55 communicates with a video-distribution-website server apparatus 11 and a management server apparatus 21.

The Bluetooth (trademark) communication unit 57 performs Bluetooth (trademark) communication with external devices.

The memory 59 stores a program PRG1 that the processing unit 61 executes.

By executing the program PRG1 stored in the memory 59, the processing unit 61 executes processes according to this embodiment of the communication terminal device 11.

FIG. 2 is a function block diagram of the server apparatus 21 according to the embodiments of the present invention.

As shown in FIG. 2, the server apparatus 21 includes a communication unit 75, a memory 79, and a processing unit 81.

The memory 79 stores a program PRG2 that the processing unit 81 executes.

By executing the program PRG2 stored in the memory 79, the processing unit 81 executes the server apparatus 21 according to this embodiment.

Below, a procedure of the interior-layout assistance method according to this embodiment is described.

<Overall Operation>

FIG. 3 is an explanatory flowchart showing an overall procedure of the interior-layout assistance method according to the first embodiment of the present invention.

Steps are described.

Some or all of the processes to be executed by the processing unit 61 of the communication terminal device 11, the processes being described herein, may be executed by the processing unit 81 of the server apparatus 21.

Step ST11:

Under control from the processing unit 61, the communication terminal device 11 scans an interior by radiating the laser light from the laser 50 to the interior, and generates 3D image data of the interior on the basis of a result of the scan and the results of the capture by the camera 51. Then, the processing unit 61 converts this 3D image data to 3D CAD data.

The processing unit 61 causes the display 52 to display 3D CAD images of the interior based on the 3D CAD data. For example, a CAD image shown in FIG. 3 is displayed.

Note that, the 3D image data is data generated by synthesizing mesh data and the results of the capture by the camera. The CAD data is data in a CAD format clearly converted to computer graphics, and does not contain the mesh data or photograph data.

In addition, the communication terminal device 11 need not necessarily generate the CAD data, and may acquire the CAD data from outside.

At this time, on the basis of a position of the communication terminal device 11 in the interior and of images taken by the camera 51, the processing unit 61 distinguishes a region in which point clouds have already been acquired and a region in which the point clouds have not yet been acquired from each other among regions in the interior. Then, the processing unit 61 causes the display 52 to display, on its screen and in different colors, the region in which the point clouds have already been acquired and the region in which the point clouds have not yet been acquired. With this, point clouds in necessary regions in the interior can be completely acquired.

Step ST12:

The user operates the operation unit 53 to perform an operation to designate and select a classification (type) of a product such as furniture or a home appliance to be arranged in the interior being a subject.

For example, the processing unit 61 may cause the display 52 to display a product-classification selection field so that the user selects or directly inputs the product classification. This product classification is, for example, a category of the product, such as a refrigerator, a shelf, a bookcase, or a sofa.

Step ST13:

On the basis of the CAD data generated or acquired in Step ST11 and of the type of and a budget for the product designated and selected by the operation in Step ST12, the processing unit 61 determines a plurality of arrangement candidates that are presented as different combinations of a space in which the product can be arranged among spaces in the interior and a product to be arranged in the space. The arrangement candidates each include a different product and a different position at which this different product is arranged. At this time, candidates respectively in which products that are of the same type but are not identical to each other are arranged may be determined as different ones of the arrangement candidates.

On the basis of the CAD data in Step ST11, the processing unit 61 specifies a size of the space in which the product can be arranged among the spaces in the interior. Specifically, the processing unit 61 specifies, for example, a width, a depth, and a height.

In addition, on the basis of the budget and the like and of the specified size, the processing unit 61 determines whether or not another product that can be arranged in the space in the interior is available, and if available, acquires data of this product from an external server.

For example, on the basis of the product classification designated in Step ST12, the processing unit 61 accesses and searches the external server for a product candidate within the budget, and acquires a size of this product candidate.

Next, the processing unit 61 *m* specifies a space in which the product candidate having the acquired size can be arranged among the spaces in the interior. If the specified space includes a plurality of spaces, the arrangement candidates are determined with regard respectively to the spaces.

If the designated classification of the product includes classifications of a plurality of products, spaces in which the plurality of these products can be arranged are specified respectively for these products. At this time, the arrangement candidates are determined in a manner that the products in different ones of the classifications are not arranged in the same space in each of the arrangement candidates.

Step ST14:

The processing unit 61 executes a process of displaying a 3D CAD image in which the product is arranged in the space where this product can be arranged, the process being executed on each of the plurality of arrangement candidates determined in Step ST13.

While viewing the CAD images depicting the plurality of arrangement candidates, the user considers which of patterns (combinations of the product and its arrangement) is good, and performs an operation to determine a pattern.

In addition, in response to the operation by the user to the operation unit 53 so as to designate the product via the CAD image, the processing unit 61 causes the display 52 to display a selection screen that allows selection of another product in the same classification as that of the product being displayed.

In response to the selection of the other product via the selection screen, the processing unit 61 generates CAD data of an arrangement of the other product, and causes a CAD image to be displayed on the basis of the CAD data.

Step ST15:

If the user operates the operation unit 53 to make a request to purchase the product selected via the CAD image displayed in Step ST14, the processing unit 61 advances the procedure to Step ST16.

Step ST16:

In response to an input of the purchase request in Step ST15, the processing unit 61 executes a process of purchasing the product selected by the user.

The communication terminal device 11 accesses, via the communication unit 55, the server apparatus 21 or other product-selling websites, and executes the purchase process.

<Operation to Purchase Product Such as Flooring>

Figure 4:
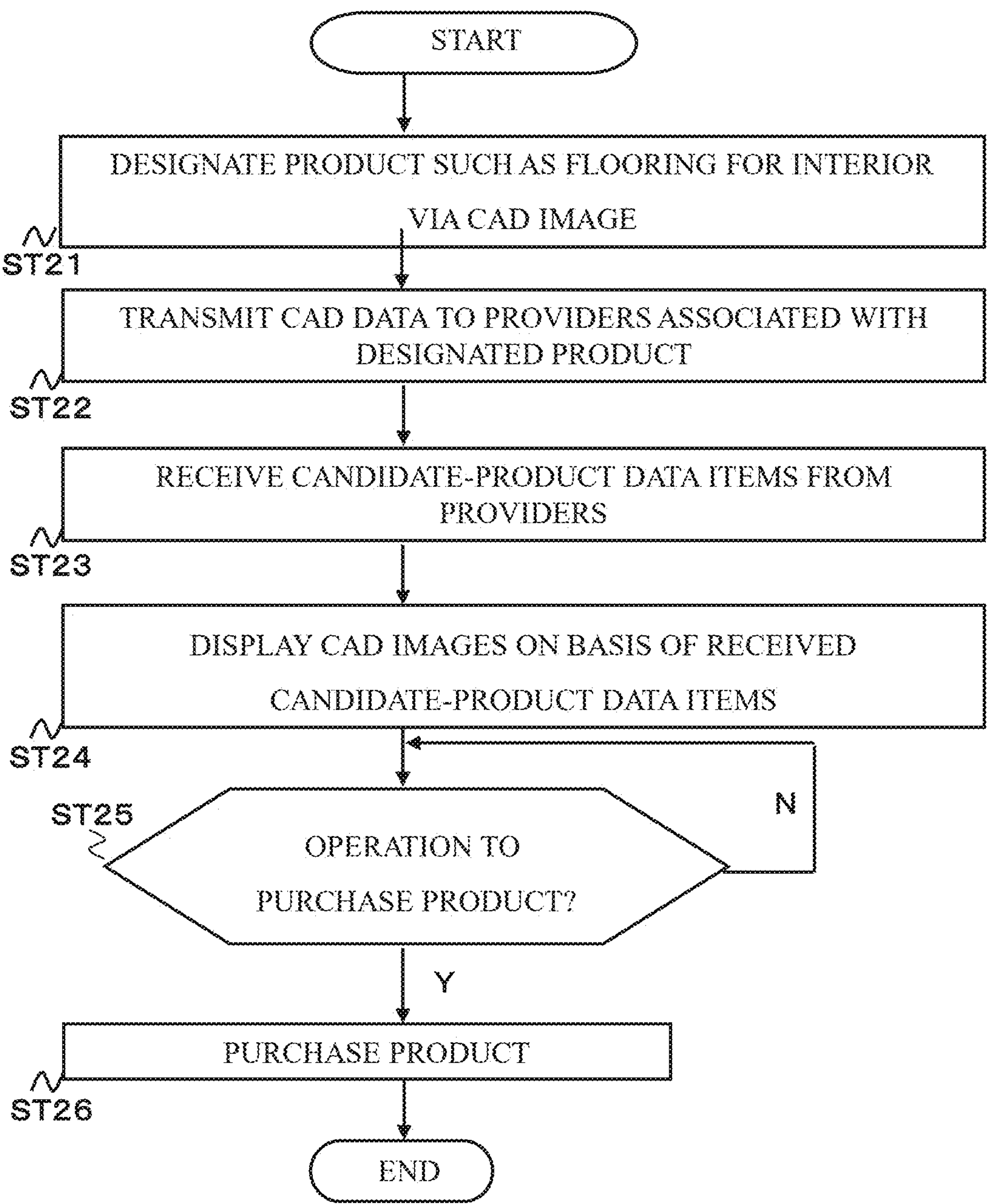
FIG. 4 is an explanatory flowchart showing a procedure of an operation to purchase a product such as flooring by the interior-layout assistance method according to the first embodiment of the present invention.

FIG. 4 is an explanatory flowchart showing a procedure of an operation to purchase the product such as flooring by the interior-layout assistance method according to the first embodiment of the present invention.

Steps are described.

Step ST21:

The user operates the operation unit 53 to perform an operation to designate, via the CAD image of the interior, the product such as a wall or the flooring for the interior, the CAD image being displayed on the display 52 on the basis of the CAD data generated in Step ST11 shown in FIG. 3.

Step ST22:

The processing unit 61 specifies a classification (type) of the product designated by the operation in Step ST21, and acquires provider information of providers that are associated in advance with the classification of the product and that provide the product.

Then, the processing unit 61 provides the CAD data corresponding to the CAD image to communication devices of the providers on the basis of the acquired provider information, the CAD image having been subjected to the designation operation.

Examples of a method of providing the CAD data include transmitting the CAD data to e-mail addresses of the providers, and uploading the CAD data to a system that is accessible to the providers.

Step ST23:

On the basis of the CAD data acquired in Step ST22, the providers transmit product data items of a plurality of candidate products (candidate-product data items) to the communication terminal device 11.

The processing unit 61 causes the memory 59 to store the plurality of candidate-product data items received from the providers.

In addition, the communication terminal device 11 may acquire, from the providers, not only the data items of the products, but also prices of these products, and information about an estimate of an installation cost, and may cause the display 52 to display these information and data.

Step ST24:

On the basis of the CAD data of the interior and of the candidate-product data items stored in the memory 59 in Step ST23, the processing unit 61 generates new CAD data of images corresponding to the candidate-product data items, the images being incorporated at positions of the products, and generates CAD images corresponding to the new CAD data.

These CAD images are generated with regard respectively to the plurality of candidate-product data items.

Step ST25:

If the user operates the operation unit 53 to make a request to purchase a product selected via the CAD image displayed in Step ST23, the processing unit 61 advances the procedure to Step ST25.

Step ST26:

In response to an input of the purchase request in Step ST24, the processing unit 61 executes a process of purchasing the product selected by the user.

First Modification of First Embodiment

Through the above-described procedure of the first embodiment, the processing unit 61 associates CAD data of interiors of users who have ever purchased products, arrangement candidates selected by these users, and the product purchased by the above-described user with each other as history data, and causes the memory 59 to store this history data.

In Step ST14 shown in FIG. 3, at the time of causing the display 52 to display the CAD images of the plurality of candidates, on the basis of the history data stored in the memory 59, the processing unit 61 determines, as arrangement candidates and products with high priorities, arrangement candidates and products that correspond to combinations with high similarity to a combination of the CAD data of the interior, the CAD data being generated or acquired in Step ST11, the classification of the product, the classification being designated in Step ST12, and the budget for the product among the arrangement candidates and the products that have ever been selected by the other users.

The similarity becomes higher, for example, as the number of common features such as areas and shapes of the interiors based on the CAD data becomes larger, the number of common features of the designated product classifications becomes larger, or the budgets become closer.

In addition, in Step ST13, the arrangement candidates and the products with the high similarity are more preferentially displayed in the CAD images on the display 52.

At the time of more preferentially displaying the arrangement candidates and the products, for example, priorities may be represented, for example, by numbers, the arrangement candidates and the products may be displayed in an order of the priorities, or the arrangement candidates and the products with higher ones of the priorities may be displayed first.

With this, arrangement candidates and products that are more likely to be selected by the user can be preferentially displayed, which enables the user to efficiently make decisions.

Second Modification of First Embodiment

In Step ST13 shown in FIG. 3, the processing unit 61 may determine the arrangement candidates and the purchase-candidate products with use of a learned model.

Figure 5:
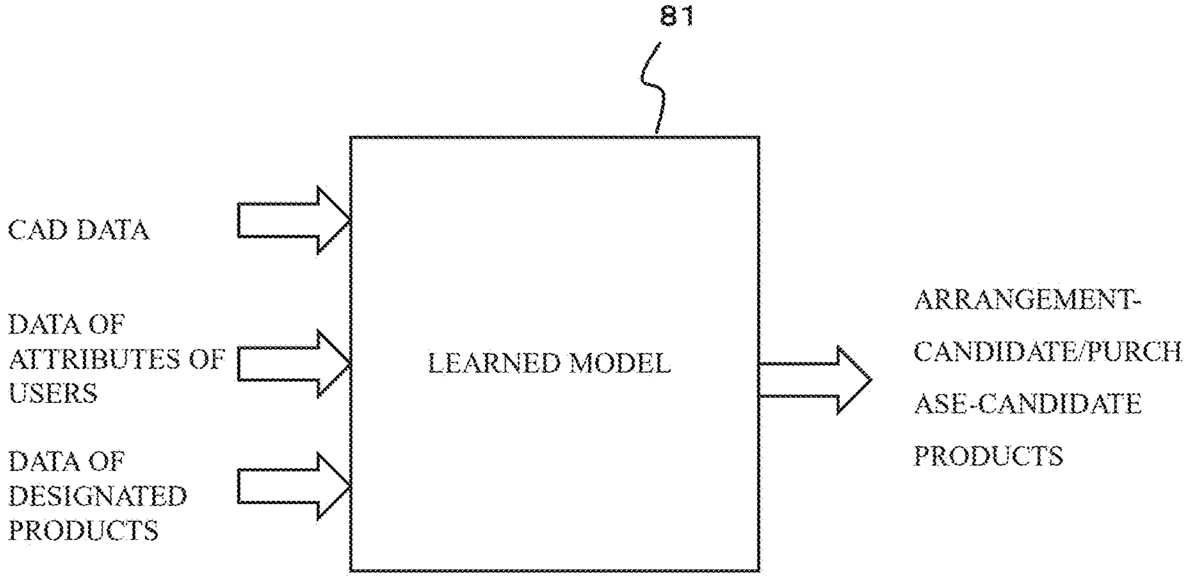
FIG. 5 is an explanatory diagram showing a second modification in which arrangement candidates and purchase-candidate products are determined with use of a learned model.

FIG. 5 is an explanatory diagram showing a second modification in which the arrangement candidates and the purchase-candidate products are determined with use of the learned model.

Specifically, the processing unit 61 executes the process of Step ST13 shown in FIG. 3 with use of the learned model.

This learned model is obtained by machine learning in which combinations of the CAD data of the interiors of the users who have ever purchased the products, the arrangement candidates selected by these users, the product purchased by the above-described user, and attributes of the users are used as training data.

The processing unit 61 may generate the learned model, or perform relearning on the basis of newly acquired information. Alternatively, the learned model may be generated by other organizations.

The processing unit 61 inputs the CAD data and the attributes of the users to the learned model, and then outputs information about the arrangement candidates and the purchase-candidate products. Only an information item with a highest one of priorities may be output, or a plurality of information items may be output in an order of the priorities.

In Step ST14, the processing unit 61 generates the candidate CAD images on the basis of the output from the learning model and of the CAD data.

In this way, by using the learned model, candidates that are suited, for example, to an attribute of the user can be determined as the number of items of the training data increases.

This second modification may be combined even with the function of the above-described first modification.

By employing the learning model in this way, more appropriate arrangement candidates and purchase candidates can be presented to the user as the number of past results increases.

Third Modification of First Embodiment

In a third modification, through the above-described procedure of the first embodiment, the processing unit 61 associates the CAD data of the interiors of the users who have ever purchased the products, the products purchased by these users, and prices of these purchased products with each other as the history data, and causes the memory 59 to store this history data.

In addition, in Step ST13 shown in FIG. 3, the processing unit 61 determines the arrangement candidates and the products with use of a learning model obtained by machine learning in which combinations of the CAD data of the interiors of the users who have ever purchased the products and the products purchased by these users are used as training data.

By employing the learning model in this way, more appropriate arrangement candidates and purchase candidates can be presented to the user as the number of the past results increases.

Figure 6:
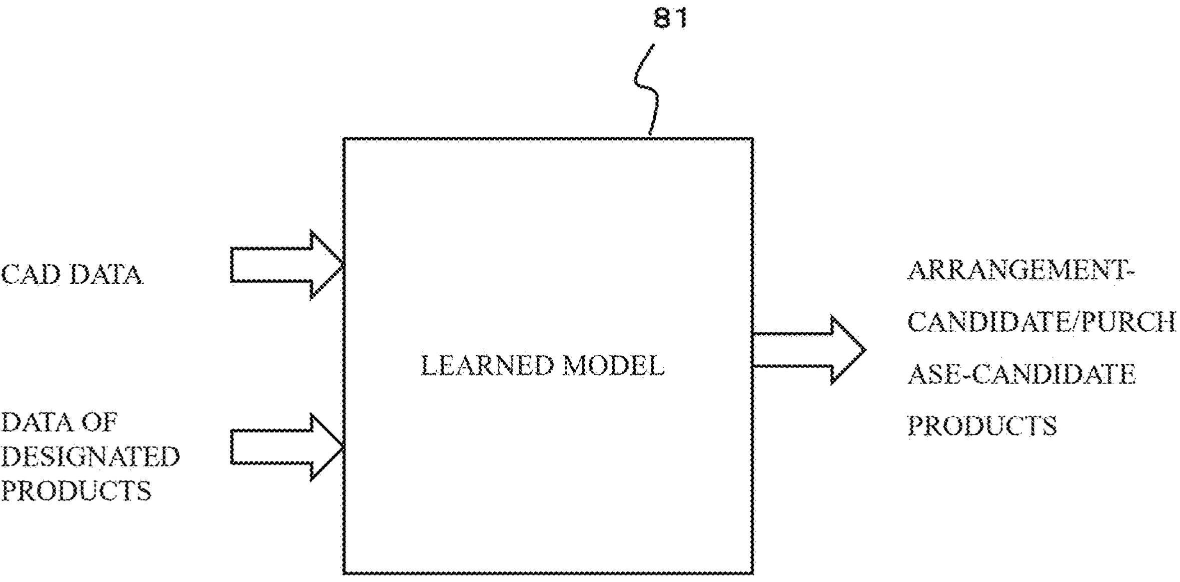
FIG. 6 is an explanatory diagram showing a learning model that is used in a third modification.

FIG. 6 is an explanatory diagram showing a learning model that is used in the third modification.

As shown in FIG. 6, in this learning model, the CAD data of the interiors of the users and the data of the products designated by these users are input, and arrangement candidates of a product and purchase-candidate products are output.

Next, on the basis of the history data stored in the memory 59 in Step ST16 shown in FIG. 3 and from among the arrangement candidates and the products determined as described above, the processing unit 61 executes a process of determining, as the arrangement candidates and the products with high priorities, the arrangement candidates and the products that correspond to combinations with high similarity to the combination of the CAD data of the interior, the classification designated by the user, and the budget corresponding to the classification among the arrangement candidates and the products that have ever been selected by the other users, and displaying these arrangement candidates and products with the high priorities.

The similarity becomes higher, for example, as the number of the common features such as areas and shapes of the interiors based on the CAD data becomes larger, the number of common features of the designated product classifications and the budgets (purchase prices) becomes larger, or the budgets become closer.

The processing unit 61 causes the display 52 to more preferentially display the arrangement candidates and the products with the high similarity in the CAD images.

At the time of more preferentially displaying the arrangement candidates and the products, for example, the priorities may be represented, for example, by numbers, the arrangement candidates and the products may be displayed in an order of the priorities, or the arrangement candidates and the products with higher ones of the priorities may be displayed first.

With this, arrangement candidates and products that are more likely to be selected by the user can be preferentially displayed, which enables the user to efficiently make decisions.

Note that, details of the third modification are the same as those described, for example, in the first embodiment except details described as those of the third modification.

According to the third modification, there is provided a configuration in which the learning model is used to determine arrangement candidates and products that are more suited to situations of the user, and in which the arrangement candidates and the products with the high similarity to the combination of the CAD data of the interior, the designated classification, and the budget corresponding to the classification among the arrangement candidates and the products that have ever been selected by the user are determined as the arrangement candidates and the products "with high priorities." In other words, determination of candidates and determination of candidates with high priorities are made in two stages. With this, the user is more likely to select arrangement candidates and products that are suited to himself/herself.

Below, a method of generating the 3D CAD data of the interior by using the communication terminal device 11 of Step ST11 shown in FIG. 3 is described.

Figure 7:
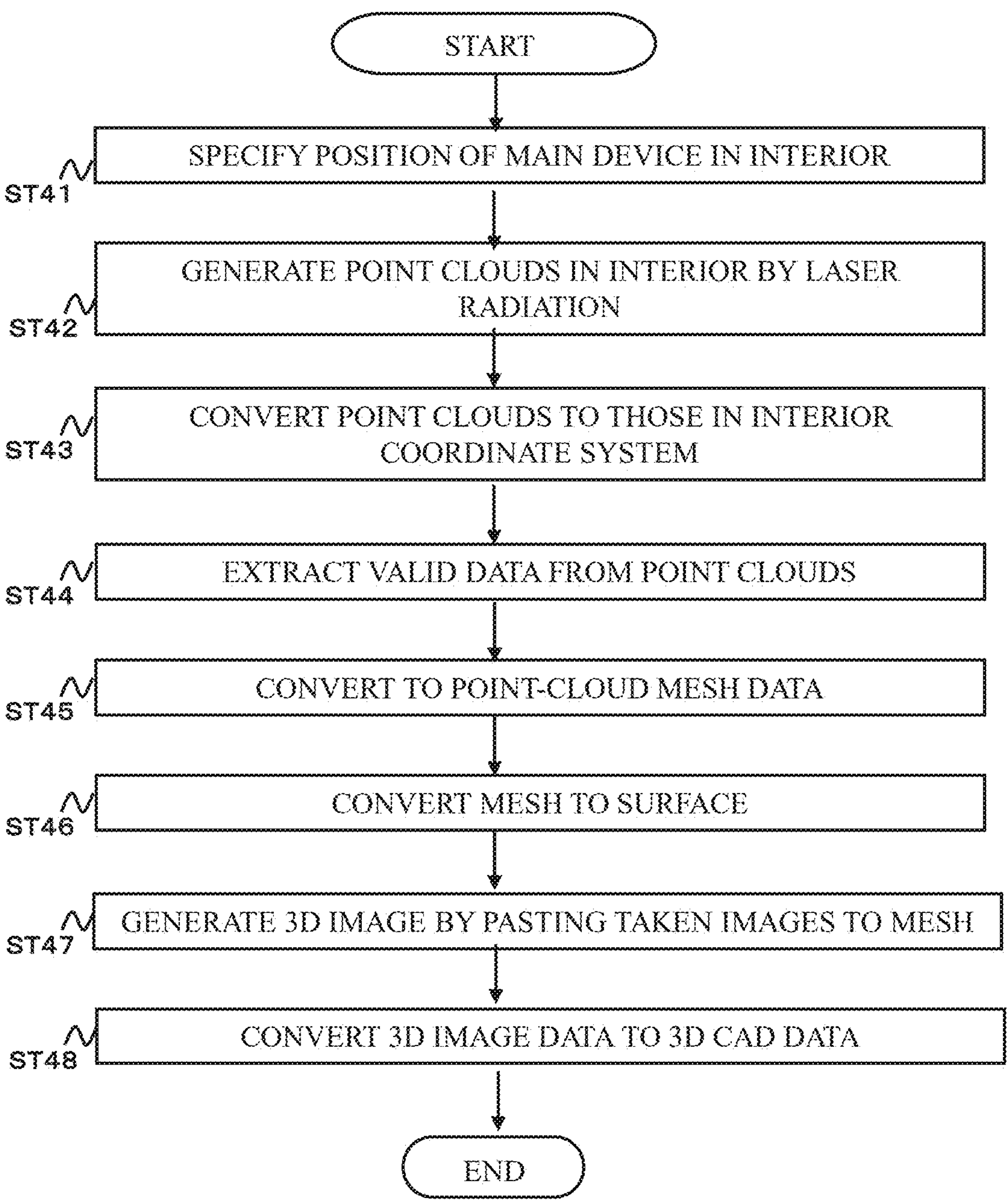
FIG. 7 is an explanatory flowchart showing details of a method of generating a 3D image of an interior, the image being shown in FIG. 3.

FIG. 7 is an explanatory flowchart showing details of a method of generating the 3D image of the interior, the image being shown in FIG. 3.

Below, Steps in FIG. 4 are described.

Step ST41:

The processing unit 61 of the communication terminal device 11 specifies (estimates) a position of the communication terminal device 11 in the interior. As this self-position estimation, for example, self-position estimation technology using LiDAR is used.

Step ST42:

While the user moves the communication terminal device 11, the laser light is radiated from the laser 50 to an entire region or a part of the region in the interior, and reflection therefrom is detected. Then, on the basis of results of the detection, the processing unit 61 generates data of point clouds of the interior and those of objects in the interior.

At the same time, positions to which the laser light from the laser 50 is radiated are captured with the camera 51.

Step ST43:

The processing unit 61 converts the point-cloud data generated in Step ST42 from that in a coordinate system for the position of the communication terminal device 11, the position having been specified in Step ST41, to that in an interior coordinate system.

Step ST44:

The processing unit 61 extracts valid data from the point-cloud data converted in Step ST43 (deletes unnecessary data). This extraction process is executed, for example, by deleting point clouds which have attributes that are the same as or similar to those of point clouds which have been specified to be unnecessary in advance.

Step ST45:

The processing unit 61 converts the point-cloud data that has been subjected to the extraction process of Step ST44 to (polygonal) mesh data.

Step ST46:

The processing unit 61 converts the mesh generated in Step ST45 to (planar) surface data. In this conversion, a predetermined plane-detection technology is used.

Step ST47:

On the basis of the surface data generated in Step ST46, the processing unit 61 generates the 3D image data (3D image) by pasting images taken by the camera 51 to the mesh, the images having been acquired in Step ST42.

Step ST48:

The processing unit 61 converts the 3D image data generated in Step ST47 to the 3D CAD data, and causes the display 52 to display this 3D CAD data.

On the basis of this 3D CAD data, the processing unit 61 specifies (measures) the size (height, vertical and horizontal widths, and layout) of the interior, and causes these dimensions to be shown in the 3D CAD image.

In addition, by the above-described procedure, the CAD data can be generated as long as walls are recognized. Thus, a 3D image of a layout without interior furniture or the like can be generated.

Note that, the learning model may be employed in some of Steps in the above-described procedure.

By the interior-layout assistance method according to this embodiment, 3D conversion can be performed everywhere, immediately, easily, and with high accuracy by using the communication terminal device 11 such as a smartphone, which leads to utilization and general prevalence of 3D technologies in all fields.

For example, the method can be used in the businesses relating to real estate, such as a renovation business, a builder's business, and a moving business.

Further, by the interior-layout assistance method according to this embodiment, a labor shortage in the construction industry can be made up for, and experience at the time of renovation can be improved.

Specifically, if 3D scanners can replace surveys and drawing that have been manually conducted, manpower can be spared for other more advanced work. As a result, higher value-added products can be provided, and cost reduction also can be achieved.

Still further, as for workers themselves, an environment in which they can concentrate on the work they are supposed to do can be established, and craftsmanship that has been acquired only through experience can be simplified to some extent. This can contribute also to recruitment and training of young people who will lead the future.

By using the 3D scanning technologies, the surveys can be significantly readily conducted.

In addition, coloring of and photograph insertion to stereoscopic videos can be performed, and these stereoscopic videos can be viewed at 360 degrees from the front, back, right, and left. With this, all involved workers are enabled not to rely on ideas of their own, and can work while shearing the same vision of a finished product.

The 3D scanning technologies enable management on devices, and hence waste of paper also can be suppressed. Such efficiency ultimately benefits consumers, which enables them to furnish their buildings more economically than before.

Yet further, according to this embodiment, applications that are capable of generating 3D models which enable measurement with high accuracy and high quality only with use of the smartphone (communication terminal device 11) with LiDAR can be developed. Anyone can easily and inexpensively perform 3D scans.

According to this embodiment, only by taking an interior video with use of the communication terminal device 11, the 3D models which enable the measurement and photograph data can be acquired and stored.

Further, according to this embodiment, output to and sharing with personal computers can be performed in various formats such as the point clouds and the mesh.

Still further, the communication terminal device 11, specifically, the procedure shown in FIG. 4 enables measurement with higher accuracy than that with tape measures.

Yet further, according to this embodiment, in accordance with a type of and a budget for a product that the user wants to purchase, arrangement candidates can be provided in a plurality of different patterns to the user. With this, the user can take arrangement candidates that the user does not conceive by himself/herself into consideration.

The plurality of arrangement candidates and the plurality of candidate products are determined, and the CAD images in which images of these products are arranged with regard respectively to the arrangement candidates can be provided to the user. Thus, on the basis of the CAD images, the user can more clearly imagine that the products are arranged respectively in the arrangement candidates. As a result, a gap between the imagination and the reality can be prevented.

Yet further, according to this embodiment, if only the user performs the operation to designate the product such as flooring via the CAD image, on the basis of the product data from providers of the product, the user can easily imagine an interior in which the product is used.

Second Embodiment

Figure 8:
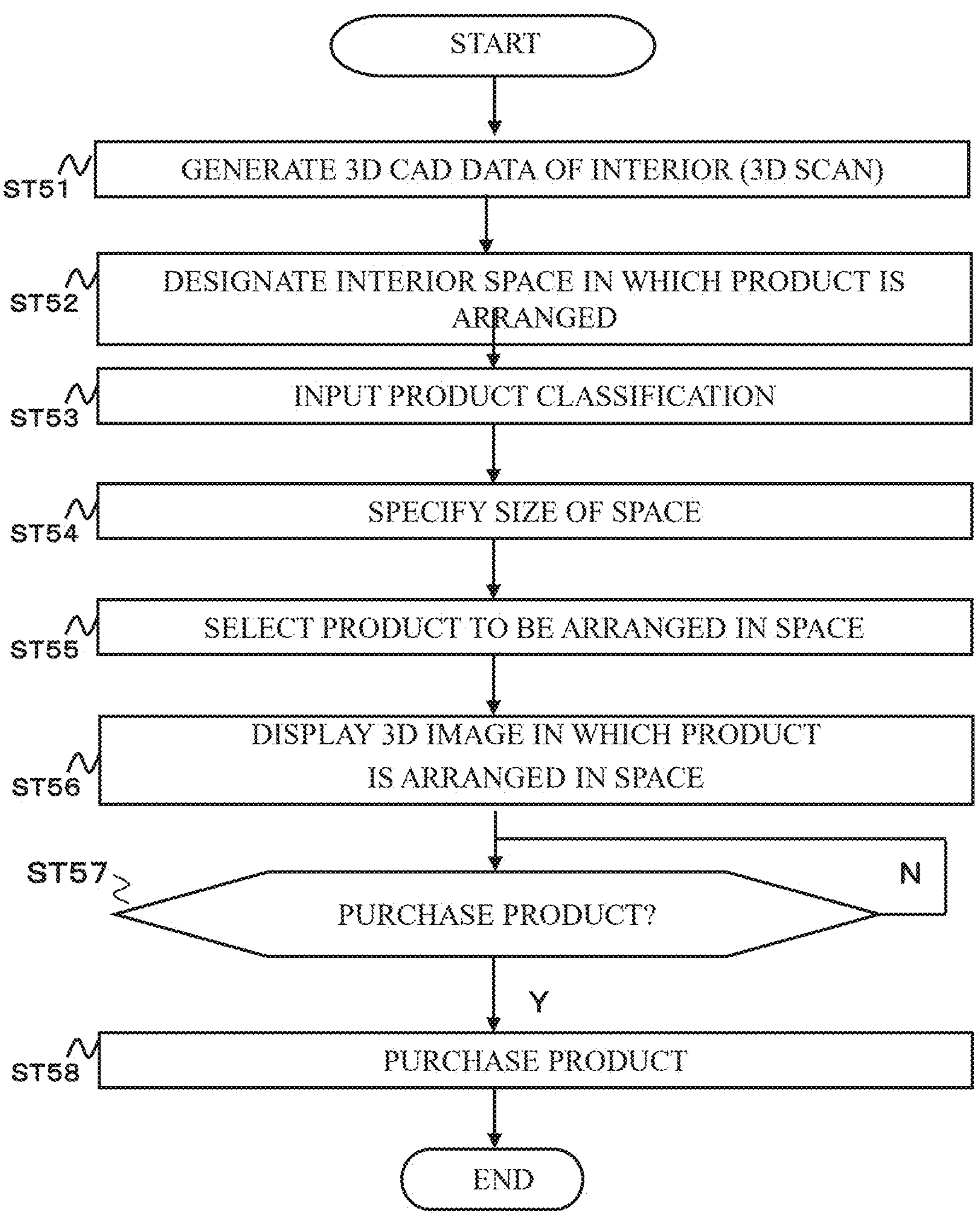
FIG. 8 is an explanatory flowchart showing an overall procedure of an interior-layout assistance method according to a second embodiment of the present invention.

FIG. 8 is an explanatory flowchart showing an overall procedure of an interior-layout assistance method according to a second embodiment of the present invention.

Steps are described.

Some or all of the processes to be executed by the processing unit 61 of the communication terminal device 11, the processes being described herein, may be executed by the processing unit 81 of the server apparatus 21.

Step ST51:

Under control from the processing unit 61, the communication terminal device 11 scans an interior by radiating the laser light from the laser 50 to the interior, and generates 3D image data of the interior on the basis of a result of the scan and results of the capture by the camera 51. Then, the processing unit 61 converts this 3D image data to 3D CAD data.

The processing unit 61 causes the display 52 to display 3D CAD images of the interior based on the 3D CAD data. For example, the CAD image shown in FIG. 3 is displayed.

Note that, the 3D image data is data generated by synthesizing mesh data and the results of the capture by the camera. The CAD data is data in a CAD format clearly converted to computer graphics, and does not contain the mesh data or photograph data.

In addition, the communication terminal device 11 need not necessarily generate the CAD data, and may acquire the CAD data from outside.

At this time, on the basis of a position of the communication terminal device 11 in the interior and of images taken by the camera 51, the processing unit 61 distinguishes a region in which point clouds have already been acquired and a region in which the point clouds have not yet been acquired from each other among regions in the interior. Then, the processing unit 61 causes the display 52 to display, on its screen and in different colors, the region in which the point clouds have already been acquired and the region in which the point clouds have not yet been acquired. With this, point clouds in necessary regions in the interior can be completely acquired.

Step ST52:

The user operates the operation unit 53 to designate, via the CAD image displayed in Step ST51, an interior space in which a product is arranged. The space is designated, for example, by moving a cursor or the like around its region.

Step ST53:

The user operates the operation unit 53 to input a product classification of the product to be arranged in the space designated in Step ST52. The user may perform the input by selecting the product classification via the product-classification selection field displayed on the display 52, or by directly inputting the product classification to the field. This product classification is, for example, the category of the product, such as a refrigerator, a shelf, a bookcase, or a sofa.

Step ST54:

On the basis of the CAD data in Step ST51, the processing unit 61 of the communication terminal device 11 specifies a size of the space designated in Step ST52. Specifically, the processing unit 61 specifies, for example, a width, a depth, and a height.

Step ST55:

The processing unit 61 searches for the product that can be arranged in the space having the size specified in Step ST54 among products belonging to the product classification input in Step ST53. This search may be made in a manner that a product which matches content of designation by the user of an at least one of a budget, a brand, and a function of the product is searched for.

The processing unit 61 causes the display 52 to display a product selection screen that shows a result of the search.

The user selects the product via the product selection screen.

The communication terminal device 11 accesses the server apparatus 21 or other product-selling websites, and displays the result of the search.

Step ST56:

The processing unit 61 causes the display 52 to display a 3D CAD image in which the product selected in Step ST55 is arranged in the space designated in Step ST52.

Step ST57:

If the user operates the operation unit 53 to make a request to purchase the product selected in Step ST55, the processing unit 61 advances the procedure to Step ST58.

In response to an input of the purchase request in Step ST57, the processing unit 61 executes a process of purchasing the product selected by the user.

The communication terminal device 11 accesses, via the communication unit 55, the server apparatus 21 or the other product-selling websites, and executes the purchase process.

Third Embodiment

In the exemplary cases of the foregoing embodiments, a product that is arranged in a scanned interior is purchased. In this embodiment, a case where renewal of a product (building material) such as the wall or the flooring in the interior is considered is described.

Below, a procedure of an interior-layout assistance method according to this embodiment is described.

Figure 9:
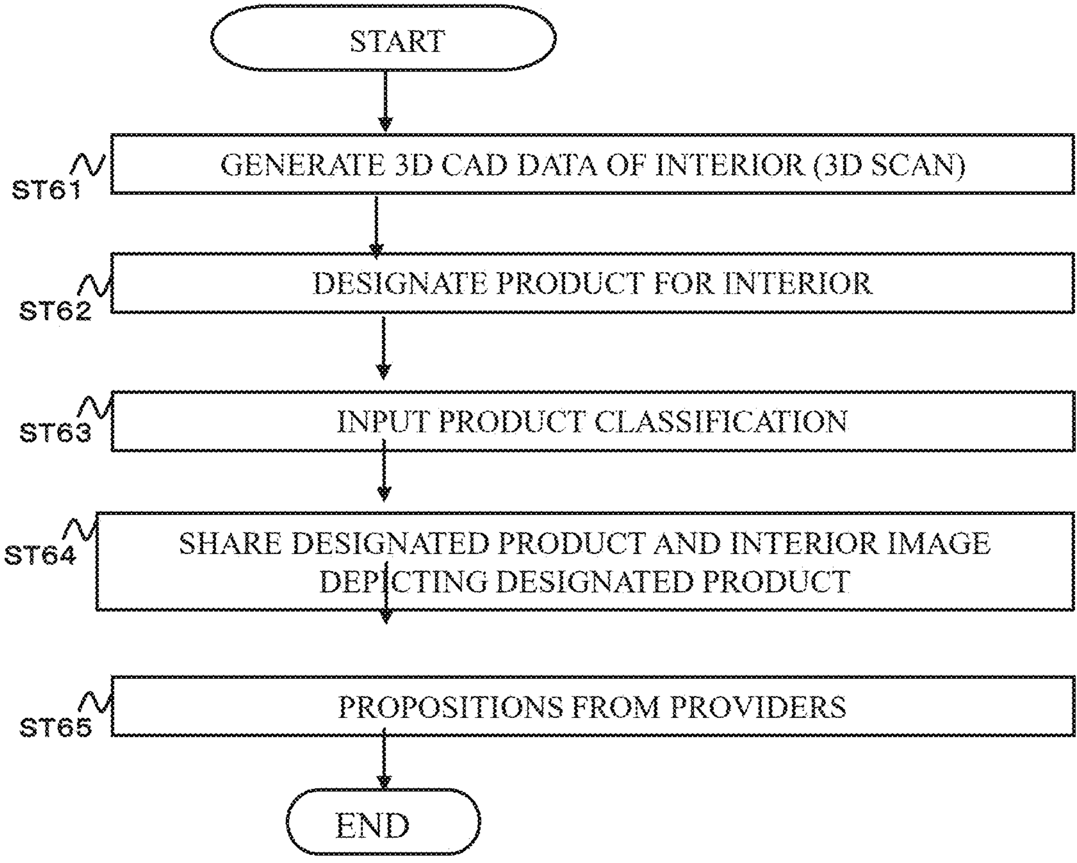
FIG. 9 is an explanatory flowchart showing an overall procedure of an interior-layout assistance method according to a third embodiment of the present invention.

FIG. 9 is an explanatory flowchart showing an overall procedure of an interior-layout assistance method according to a third embodiment of the present invention.

Steps are described.

Step ST61:

Under control from the processing unit 61, the communication terminal device 11 scans an interior by radiating the laser light from the laser 50 to the interior, and generates 3D image data of the interior on the basis of a result of the scan and results of the capture by the camera 51. Then, the processing unit 61 converts this 3D image data to 3D CAD data.

In Step ST61, the same process as that of Step ST11 described in the first embodiment is executed.

Step ST62:

The user operates the operation unit 53 to designate, via a CAD image displayed in Step ST61, the product (building material) such as the flooring or the wall for the interior. This designation is performed, for example, by pointing to an image of the product with use of a cursor or the like or by moving the cursor or the like around its region. Step ST63:

The user operates the operation unit 53 to input a product classification of the product designated in Step ST62. The user may perform the input by selecting the product classification via the product-classification selection field displayed on the display 52, or by directly inputting the product classification to the field. This product classification is, for example, the category of the product, such as the wall or the flooring.

Step ST64:

The processing unit 61 of the communication terminal device 11 transmits (shares) the product designated by the user in Step ST61 and its 3D image to providers (such as a designer and a builder) that are associated in advance with the product classification designated by the user in Step ST63. At this time, the communication terminal device 11 transmits information about a size of the product (such as a size of the wall or a size of the flooring) to terminal devices of the providers. In addition, information such as demands on the product from the user may be transmitted from the communication terminal device 11 to the terminal devices of the providers.

Step ST65:

On the basis of the product, the demands from the user, and the CAD image shared in Step ST64, the providers propose products that are suited to the interior of the user, and transmit information about estimates of prices of the products, installation costs, and the like to the communication terminal device 11. At this time, the providers may provide CAD images containing images of the products to the communication terminal device 11. In addition, information about the propositions of the products may be transmitted from the terminal devices of the providers to the communication terminal device 11.

As described above, the interior-layout assistance method according to the second embodiment enables the user also to issue a request for a proposition or a request for an estimate of a product such as an interior building material to the providers only by designating this product via the CAD image of the interior with use of the communication terminal device 11.

Further, the providers can acquire the 3D image of the interior of the user, and hence can make more appropriate propositions and give more accurate estimates of renovation and the like.

Still further, if functions of the communication terminal device 11 can be used by the providers such as design firms, more appropriate propositions can be made.

The present invention is not limited to the above-described embodiments.

Specifically, those skilled in the art may make various modifications, combinations, sub-combinations, and alterations of the components of the above-described embodiments within the technical scope of the present invention or the equivalents thereof.

INDUSTRIAL APPLICABILITY

The present invention is appliable to a system that enables selection of a product to be arranged in an interior.

The invention claimed is:

1. An interior-layout assistance method, comprising:

a first step of acquiring or generating three-dimensional (3D) computer-aided-design (CAD) data of an interior;

a second step of receiving designation of a classification of, and a budget for, a product, the product being at least one of a furniture and a home appliance, to be arranged in the interior, the designation being received from a user;

a third step of determining a plurality of arrangement candidates that are presented as different combinations of a space in which the product can be arranged among spaces in the interior and the product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of:

displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of:

associating 3D CAD data of interiors of users who have ever purchased products, the products purchased by the users, and prices of the products purchased by the users with each other as history data, and storing the history data into a memory, the first step, the second step, the third step, the fourth step, the fifth step, and the sixth step being carried out by a computer, the third step including executing a process of:

determining the plurality of arrangement candidates and products with use of a learning model obtained by machine learning in which combinations of the 3D CAD data of the interiors of the users who have ever purchased the products and the products purchased by the users are used as training data, and displaying, as arrangement candidates and products with high priorities, arrangement candidates and products that correspond to combinations with high similarity to a combination of the 3D CAD data of the interior, the designated classification, and the budget corresponding to the designated classification, the displaying of the arrangement candidates and the products with the high priorities being performed on a basis of the history data stored in the memory in the sixth step and from among the plurality of determined arrangement candidates and the determined products among the arrangement candidates and the products that have ever been selected by the other users.

2. The interior-layout assistance method according to claim 1, further comprising:

a seventh step of receiving designation of a product being at least one of a flooring and a wall for the interior, the designation being received from a user and on the basis of the 3D CAD data;

an eighth step of transmitting the 3D CAD data to providers that are associated in advance with the product designated in the seventh step; and a ninth step of receiving, from the providers, product data items about candidates of the product designated in the seventh step, wherein the seventh step, the eighth step, and the ninth step are carried out by the computer, and wherein, in the fourth step, the 3D CAD images are displayed on a basis of the product data items received in the ninth step.

3. The interior-layout assistance method according to claim 1, wherein, in the second step, designation of a family structure of the user is received from the user, and wherein, in the third step, the plurality of arrangement candidates are determined on a basis of the family structure designated in the second step.

4. The interior-layout assistance method according to claim 1, further comprising a step of executing a process in which the user purchases a purchase candidate in accordance with an instruction from the user after the fourth step.

5. The interior-layout assistance method according to claim 1, wherein, in the first step, the computer carries out:

an eleventh step of specifying a position in the interior of a main device that performs laser radiation, a twelfth step of generating point clouds of the interior and of objects in the interior by the laser radiation, a thirteenth step of converting the generated point clouds from point clouds in a coordinate system for the specified main device to point clouds in an interior coordinate system, a fourteenth step of extracting valid data from the point clouds, a fifteenth step of converting the point clouds to (polygonal) mesh data, a sixteenth step of converting the mesh to surface data, a seventeenth step of generating 3D image data by pasting taken images to the mesh on a basis of the surface data, and an eighteenth step of converting the 3D image data generated in the seventeenth step to the 3D CAD data.

6. The interior-layout assistance method according to claim 5, wherein a shape and a size of the interior are specified on a basis of the surface data, and wherein the size is shown in the displayed images.

7. The interior-layout assistance method according to claim 5, wherein a region in which the point clouds have already been acquired and a region in which the point clouds have not yet been acquired among regions in the interior are distinguished from each other on a basis of the position of the main device and a basis of the taken images, and wherein the region in which the point clouds have already been acquired and the region in which the point clouds have not yet been acquired are displayed in different colors on a screen.

8. An interior-layout assistance method, comprising:

a first step of acquiring or generating three-dimensional (3D) computer-aided-design (CAD) data of an interior;

a second step of receiving designation of a classification of, and a budget for, a product, the product being at least one of a furniture and a home appliance, to be arranged in the interior, the designation being received from a user;

a third step of determining a plurality of arrangement candidates that are presented as different combinations of a space in which the product can be arranged among spaces in the interior and the product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of:

associating 3D CAD data of interiors of users who have ever purchased products, a plurality of arrangement candidates selected by the users, and a product purchased by the user with each other as history data, and storing the history data into a memory, the first step, the second step, the third step, the fourth step, the fifth step, and the sixth step being carried out by a computer, the third step including determining, as arrangement candidates and products with high priorities, arrangement candidates and products that correspond to combinations with high similarity to a combination of the 3D CAD data of the interior, the designated classification, and the budget corresponding to the designated classification among the arrangement candidates and the products that have ever been selected by the other users, the determining of the arrangement candidates and the products with the high priorities being performed on a basis of the history data stored in the memory in the sixth step, the third step including determining the plurality of arrangement candidates and the products with use of a learning model obtained by machine learning in which combinations of the 3D CAD data of the interiors of the users who have ever purchased the products, the plurality of arrangement candidates selected by the users, the product purchased by the user, and attributes of the users are used as training data.

9. A program, stored on a non-transitory computer-readable storage medium, for causing a computer to carry out:

a first step of acquiring or generating three-dimensional (3D) computer-aided-design (CAD) data of an interior;

a second step of receiving designation of a classification of, and a budget for, a product, the product being at least one of a furniture and a home appliance, to be arranged in the interior, the designation being received from a user;

a third step of determining a plurality of arrangement candidates that are presented as different combinations of a space in which the product can be arranged among spaces in the interior and the product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of:

displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of:

associating 3D CAD data of interiors of users who have ever purchased products, the products purchased by the users, and prices of the products purchased by the users with each other as history data, and storing the history data into a memory, the third step including executing a process of determining the plurality of arrangement candidates and products with use of a learning model obtained by machine learning in which combinations of the 3D CAD data of the interiors of the users who have ever purchased the products and the products purchased by the users are used as training data, and displaying, as arrangement candidates and products with high priorities, arrangement candidates and products that correspond to combinations with high similarity to a combination of the 3D CAD data of the interior, the designated classification, and the budget corresponding to the designated classification, the displaying of the arrangement candidates and the products with the high priorities being performed on a basis of the history data stored in the memory in the sixth step and from among the plurality of determined arrangement candidates and the determined products among the arrangement candidates and the products that have ever been selected by the other users.

10. A program, stored on a non-transitory computer-readable storage medium, for causing a computer to carry out:

a first step of acquiring or generating three-dimensional (3D) computer-aided-design (CAD) data of an interior;

a second step of receiving designation of a classification of, and a budget for, a product, the product being at least one of a furniture and a home appliance, to be arranged in the interior, the designation being received from a user;

a third step of determining a plurality of arrangement candidates that are presented as different combinations of a space in which the product can be arranged among spaces in the interior and the product to be arranged in the space, the determining of the plurality of arrangement candidates being performed on a basis of the 3D CAD data acquired or generated in the first step and of the classification of and the budget for the product, the classification and the budget being designated in the second step;

a fourth step of displaying a 3D CAD image in which the product is arranged in the space in which the product can be arranged, the displaying of the 3D CAD image being performed with regard to each of the plurality of arrangement candidates determined in the third step;

a fifth step of:

displaying a selection screen that allows selection of another product in a same classification as a classification of the product being displayed, the displaying of the selection screen being performed in response to designation of the product by the user via the 3D CAD image displayed in the fourth step, and generating 3D CAD data of an arrangement of the other product in response to the selection of the other product via the selection screen; and a sixth step of:

associating 3D CAD data of interiors of users who have ever purchased products, a plurality of arrangement candidates selected by the users, and a product purchased by the user with each other as history data, and storing the history data into a memory, the third step including determining, as arrangement candidates and products with high priorities, arrangement candidates and products that correspond to combinations with high similarity to a combination of the 3D CAD data of the interior, the designated classification, and the budget corresponding to the designated classification among the arrangement candidates and the products that have ever been selected by the other users, the determining of the arrangement candidates and the products with the high priorities being performed on a basis of the history data stored in the memory in the sixth step, the third step including determining the plurality of arrangement candidates and the products with use of a learning model obtained by machine learning in which combinations of the 3D CAD data of the interiors of the users who have ever purchased the products, the plurality of arrangement candidates selected by the users, the product purchased by the user, and attributes of the users are used as training data.

11. An interior-layout assistance system, comprising:

first means for acquiring or generating three-dimensional (3D) computer-aided-design (CAD) data of an interior;

second means for receiving designation of a classification of, and a budget for, a product, the product being at least one of a furniture and a home appliance, to be arranged in the interior, the designation being received from a user;

third means for determining a plurality of arrangement candidates that are presented as different combinations of a space in which the product can be arranged among spaces in the interior and the product to be arranged in the space, the determining of the plurality of arrangement candidates being performed on a basis of the 3D CAD data acquired or generated by the first means and of the classification of and the budget for the product, the classification and the budget being designated by the second means;

fourth means for displaying a 3D CAD image in which the product is arranged in the space in which the product can be arranged, the displaying of the 3D CAD image being performed with regard to each of the plurality of arrangement candidates determined by the third means;

fifth means for:

displaying a selection screen that allows selection of another product in a same classification as a classification of the product being displayed, the displaying of the selection screen being performed in response to designation of the product by the user via the 3D CAD image displayed by the fourth means, and generating 3D CAD data of an arrangement of the other product in response to the selection of the other product via the selection screen; and sixth means for:

associating 3D CAD data of interiors of users who have ever purchased products, the products purchased by the users, and prices of the products purchased by the users with each other as history data, and storing the history data into a memory, the third means executing a process of determining the plurality of arrangement candidates and products with use of a learning model obtained by machine learning in which combinations of the 3D CAD data of the interiors of the users who have ever purchased the products and the products purchased by the users are used as training data, and displaying, as arrangement candidates and products with high priorities, arrangement candidates and products that correspond to combinations with high similarity to a combination of the 3D CAD data of the interior, the designated classification, and the budget corresponding to the designated classification, the displaying of the arrangement candidates and the products with the high priorities being performed on a basis of the history data stored in the memory by the sixth means and from among the plurality of determined arrangement candidates and the determined products among the arrangement candidates and the products that have ever been selected by the other users.

12. An interior-layout assistance system, comprising:

first means for acquiring or generating three-dimensional (3D) computer-aided-design (CAD) data of an interior;

second means for receiving designation of a classification of, and a budget for, a product, the product being at least one of a furniture and a home appliance, to be arranged in the interior, the designation being received from a user;

third means for determining a plurality of arrangement candidates that are presented as different combinations of a space in which the product can be arranged among spaces in the interior and the product to be arranged in the space, the determining of the plurality of arrangement candidates being performed on a basis of the 3D CAD data acquired or generated by the first means and of the classification of and the budget for the product, the classification and the budget being designated by the second means;

fourth means for displaying a 3D CAD image in which the product is arranged in the space in which the product can be arranged, the displaying of the 3D CAD image being performed with regard to each of the plurality of arrangement candidates determined by the third means;

fifth means for:

displaying a selection screen that allows selection of another product in a same classification as a classification of the product being displayed, the displaying of the selection screen being performed in response to designation of the product by the user via the 3D CAD image displayed by the fourth means, and generating 3D CAD data of an arrangement of the other product in response to the selection of the other product via the selection screen; and sixth means for:

associating 3D CAD data of interiors of users who have ever purchased products, a plurality of arrangement candidates selected by the users, and a product purchased by the user with each other as history data, and storing the history data into a memory, the third means determining, as arrangement candidates and products with high priorities, arrangement candidates and products that correspond to combinations with high similarity to a combination of the 3D CAD data of the interior, the designated classification, and the budget corresponding to the designated classification among the arrangement candidates and the products that have ever been selected by the other users, the determining of the arrangement candidates and the products with the high priorities being performed on a basis of the history data stored in the memory by the sixth means, the third means determining the plurality of arrangement candidates and the products with use of a learning model obtained by machine learning in which combinations of the 3D CAD data of the interiors of the users who have ever purchased the products, the plurality of arrangement candidates selected by the users, the product purchased by the user, and attributes of the users are used as training data.

* * * * *